United States Patent
Mischel et al.

(10) Patent No.: US 6,476,423 B2
(45) Date of Patent: Nov. 5, 2002

(54) OPTICAL DETECTOR

(75) Inventors: Peter Mischel, Heilbronn (DE); Heike Peppermueller-Frangen, Heilbronn (DE)

(73) Assignee: Vishay Semiconductor GmbH, Heilbronn (DE)

( * ) Notice: Subject to any disclaimer, the term of this patent is extended or adjusted under 35 U.S.C. 154(b) by 0 days.

(21) Appl. No.: 09/858,170

(22) Filed: May 15, 2001

(65) Prior Publication Data

US 2001/0045568 A1 Nov. 29, 2001

(30) Foreign Application Priority Data

May 18, 2000 (DE) .......................... 100 24 473

(51) Int. Cl.$^7$ ............................................ H01L 31/072
(52) U.S. Cl. .................... 257/184; 257/185; 257/436; 257/458; 257/464
(58) Field of Search ............................... 257/184, 185, 257/436, 458, 464

(56) References Cited

U.S. PATENT DOCUMENTS

| | | | |
|---|---|---|---|
| 4,170,781 A | | 10/1979 | Cox et al. |
| 4,207,586 A | * | 6/1980 | Lebailly ............... 357/52 |
| 4,363,963 A | | 12/1982 | Ando |
| 4,411,732 A | | 10/1983 | Wotherspoon |
| 5,880,489 A | * | 3/1999 | Funaba et al. .......... 257/184 |
| 6,326,649 B1 | * | 12/2001 | Chang et al. ............... 257/184 |

FOREIGN PATENT DOCUMENTS

| | | | |
|---|---|---|---|
| DE | 4214036 | | 11/1993 |
| DE | 19729931 | | 1/1999 |
| EP | 0866503 | | 9/1998 |
| EP | 0866503 A2 | * | 9/1998 |
| EP | 0889533 | | 1/1999 |
| JP | 5-190886 | | 7/1993 |
| JP | 5-190887 A | * | 7/1993 |
| JP | 5-190887 | | 7/1993 |
| JP | 06120553 A | * | 4/1994 |
| JP | 10041537 A | * | 2/1998 |
| JP | 10270742 A | * | 10/1998 |

* cited by examiner

Primary Examiner—Nathan J. Flynn
Assistant Examiner—Remmon R. Fordé
(74) Attorney, Agent, or Firm—W. F. Fasse; W. G. Fasse

(57) ABSTRACT

Optical detectors used for remote controls must be able to function over long distances and under various environmental conditions. They must therefore have a high sensitivity, which means they also respond to electrical and magnetic inference fields. The present optical detector avoids the need of being packed in an assembly, which has an additional internal metal shield for protection against electromagnetic interference. In this optical detector, the surface is coated with polysilicon, except for the top-lying cathode contact. Furthermore, a thick oxide layer is arranged between the substrate and the polysilicon coating, which is contacted to a highly $p^+$-doped region of the substrate. Such optical detectors, which are not subject to electromagnetic interference, are primarily required for remote controls.

16 Claims, 1 Drawing Sheet

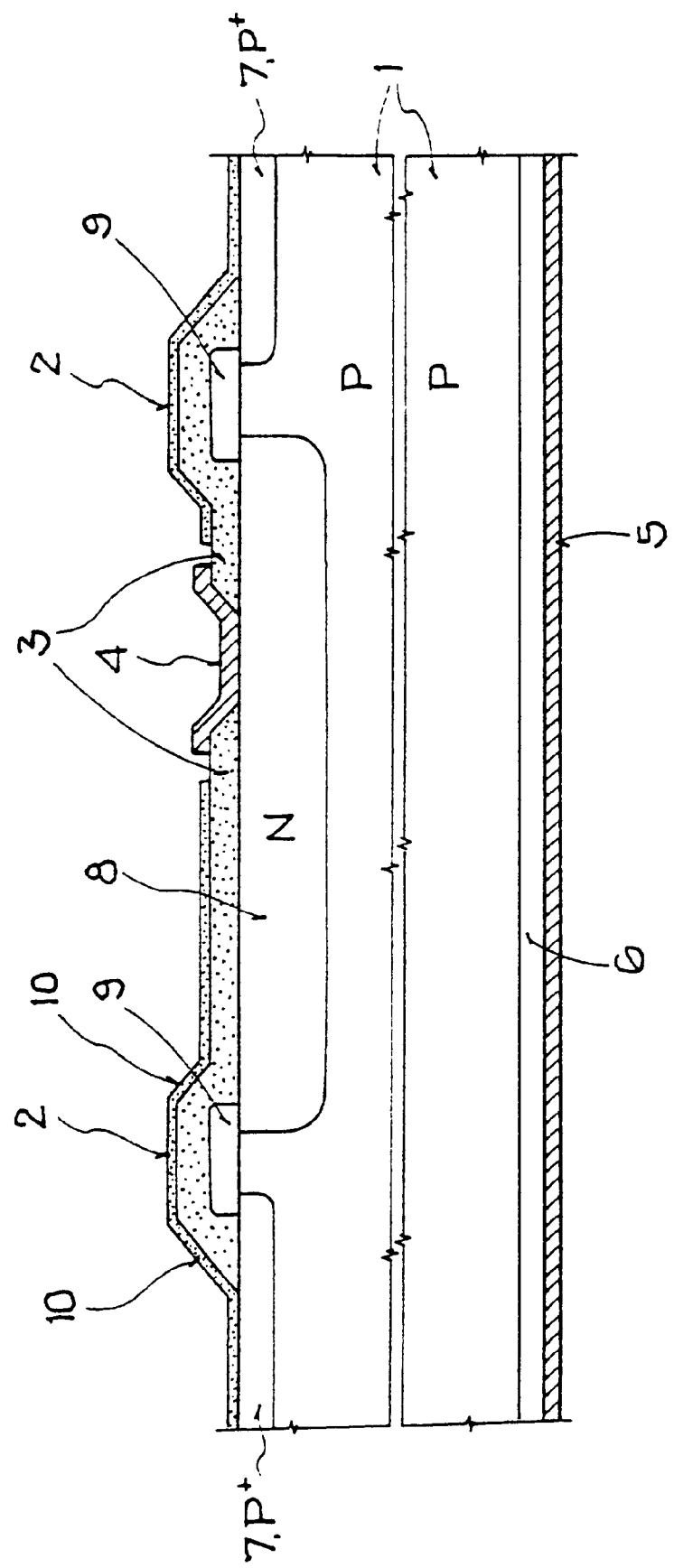

OPTICAL DETECTOR

The present invention relates to an optical detector with shielding against electromagnetic interference.

BACKGROUND OF THE INVENTION

Optical detectors are used, among other applications, in remote controls for converting optical signals emitted e.g. by an infrared emitting diode (IRED) into electrical signals. Because the remote controls should be able to function over long distances and thus react very sensitively to optical radiation, they must be screened against electromagnetic interference generated by, for example, switched mode power supplies. For this reason, previous assemblies have used a semiconductor photodiode with an n-type doped substrate which has a p-type doped area on the upper-side. The p-type doped area on the upper-side of the optoelectronic detector is connected to ground, and thus protected against electromagnetic interference. The remaining surface of the n-type doped substrate, in particular the side surfaces and the back are to some extent protected against electromagnetic influence by using additional mechanical shields. Such components have a solid or latticed metal shield which is arranged around the optical detector as an additional part in the inside. In this way, the detector is inset in a trough-shaped recess which is arranged in the mounting frames and closed by an optically transparent cover.

The disadvantages with this arrangement are that an additional case part is required, and the dimensions of this type of shielded optical detector are very large. Moreover, the angular characteristic of the assembled component is restricted by the trough and cover required. Another disadvantage is that a very large part of the semiconductor detector remains sensitive to electromagnetic interference.

In EP 0866 503 A2, an optical detector is disclosed in which an active, n-type doped, light-sensitive semiconductor area is arranged on a p-type doped semiconductor substrate, whereby a further highly p-type doped semiconductor layer is arranged on the surface of the active semiconductor area which covers the active semiconductor area in the shape of fingers. This additional semiconductor structure serves as a protective shield against the electromagnetic interference. Finally, the upper-side, including the protective shield, is covered by an insulating layer.

The disadvantage of this assembly is the technically difficult manufacture, in which additional doping has to be brought into the semiconductor materials. Furthermore, such an optical detector assembly has an additional large capacitance.

The object of the invention is to describe an optical detector which is protected against electromagnetic influence, without an additional external shield, and which can be manufactured simply and inexpensively without additional semiconductor processes.

SUMMARY OF THE INVENTION

The object of the invention is achieved in an optical detector according to the invention in that the optical detector with a p-type doped substrate has a coating of a conductive, transparent material which serves as a protective shield against the electromagnetic interference, and which carries away the charges generated by the electromagnetic interference. An insulating layer is arranged between the coating of conductive transparent material and an n-type doped active region provided on or embedded in the p-type substrate. The coating of conductive transparent material physically and electrically contacts a doped and preferably highly $p^+$-type doped layer of the substrate to conduct away the charges.

The advantages of the invention are that such a type of electromagnetic protection is very inexpensive and can be attached by simple means during the manufacture of the wafer crystal. The surfaces which are sensitive to electromagnetic interference are reduced in size. This method does not need any additional finger-shaped semiconductor structures. Furthermore, it eliminates the need for separate parts for shielding the detector, so that detector devices, which are shielded against electromagnetic interference, in particular remote controls, can be inexpensively assembled in smaller packages. Moreover, troughs and covers, which unnecessarily reduce the angular characteristic of the detector unit, are no longer needed for the further assembly in a package. Furthermore, simpler mounting frames can be used. Finally, one bonding process is eliminated from the assembly of the detector.

Advantageous further developments include the following features. Conductive polysilicon or ITO (indium tin oxide) is used for the coating with which the upper-side of the detector is coated. The overhead capacitance of the assembly is reduced if an $SiO_2$ insulating layer is additionally arranged between the active layer and the polysilicon coating, and if furthermore the polysilicon layer is electrically connected to the substrate via a highly $p^+$-type doped semiconductor layer. The LTO (low temperature oxide) process is suitable for applying the oxide layer. It also proves to be advantageous if, on the back of the substrate, there is a highly $p^+$-type doped semiconductor layer which ensures a good ground contact. In order to ensure a sufficient coating of polysilicon on the front surfaces of the oxide layer, the edges of the oxide layer are not rectangular but beveled. These beveled edges are created by taper etching.

The invention is explained in the following by means of an embodiment.

BRIEF DESCRIPTION OF THE DRAWING

The single drawing figure shows a silicon photodiode with a polysilicon coating and a thick $SiO_2$ insulating layer, which photodiode serves as an optical detector for a remote control device.

DESCRIPTION OF THE PREFERRED EMBODIMENTS

A p-type doped substrate 1, in particular silicon, is used as a substrate. A highly $p^+$-type doped area 6 is located on the back of the substrate 1 to improve the metallic contact. The metallization 5 lying underneath serves as the back contact for the anode, and is later connected to ground. In the upper-side of the p-type doped substrate 1, there is an n-type doped area 8 embedded in the substrate 1. A highly $p^+$-type doped area 7 is arranged in the p-type doped substrate 1 laterally alongside the n-type doped area 8, at the top in the outer area of the arrangement. The substrate 1 is located between the n-type doped area 8 and the highly $p^+$-type doped area 7. On the upper-side, there is a layer 9 which remains after the technological processes (diffusions) have been performed during the manufacture of the photodiode. It has no significance for the function of the component. A sufficiently thick oxide layer is applied to a part of the highly $p^+$-type doped area 7, to the existing residual layer 9 and to the n-type doped area. In the embodiment, the oxide layer 3 is a few μm thick and consists of $SiO_2$. This thick layer is applied by means of an LTO (low temperature oxide)

process during the manufacture of the wafer crystals. The edges of the oxide layer are not rectangular but beveled. This can be realized by taper etching during the manufacture of the wafer crystals. The metallic front-side contact 4, in the embodiment the cathode, is realized in the oxide layer 3 on the n-type doped area 8. At the very top, there is a coating 2 of transparent and conductive polysilicon which completely covers the surface of the upper-side except for the cathode contact area 4. The polysilicon coating 2 and the front-side contact 4 are not in electrical contact with one another. The polysilicon is also already applied during the manufacture of the wafer. The conductivity of the polysilicon is achieved by means of boron implantation. ITO (indium tin oxide) may also be used as an alternative transparent and conductive material.

The function of the arrangement and the individual layers is described in the following. If the back contact 5, the anode, is attached to ground, then the p-type doped substrate 1 is also set to ground via the highly $p^+$-type doped area 6. The substrate is protected in this way from electromagnetic interference, especially on the side surfaces. Charges arising by electromagnetic interference are conducted to ground. This also applies to the smaller, highly $p^+$-type doped area 7 lying at the top, which is arranged in the p-type doped substrate 1. The n-type doped area 8 is not connected to ground. Here, charges arising from an electromagnetic interference could falsify the current flow which is generated by optical radiation and which is to be measured. However, the electromagnetically generated charges are already dissipated here because the transparent and conductive polysilicon 2 is located above it, and this is in turn connected to ground via the p+-type doped area 7. The thick oxide layer 3 is needed for this assembly in order to prevent overhead capacitances between the polysilicon layer 2 and the n-type doped area 8. The beveled front surfaces 10 of the oxide layer 3 serve to enable the polysilicon 2 to adhere during the manufacture of the wafer crystals, and not rip off as in the case of perpendicular edges.

A polysilicon coating can also protect phototransistors against electromagnetic interference.

What is claimed is:

1. A semiconductor optical detector, comprising:
   a p-type doped substrate;
   an n-type doped active region, in which incident optical radiation is converted into an electrical current, and which is arranged on or embedded in said substrate;
   a coating layer of an electrically conductive and optically transparent material arranged over said n-type doped active region; and
   an insulating layer arranged between said coating layer and said n-type doped active region;
   wherein said coating layer is directly physically and electrically contacted onto a portion of said p-type doped substrate.

2. The semiconductor optical detector according to claim 1, wherein said substrate includes a p-type doped general substrate portion and a highly $p^+$-type doped layer portion arranged on or embedded in said general substrate portion.

3. The semiconductor optical detector according to claim 2, wherein said highly $p^+$-type doped layer portion is said portion of said substrate onto which said coating layer is directly physically and electrically contacted.

4. The semiconductor optical detector according to claim 3, wherein a back side of said general substrate portion opposite said coating layer is electrically grounded, and a grounding conduction path is established along said coating layer and from said coating layer through said highly $p^+$-type doped layer portion into said general substrate portion and therethrough to said back side thereof which is electrically grounded.

5. The semiconductor optical detector according to claim 3, wherein said n-type doped active region and said highly $p^+$-type doped layer portion are both respectively embedded next to one another in said general substrate portion with a strip of said general substrate portion remaining between and separating said n-type doped active region and said highly $p^+$-type doped layer portion.

6. The semiconductor optical detector according to claim 3, further comprising a metal front-side contact arranged on and electrically contacting said active region, and wherein said insulating layer is arranged on and entirely covers said active region except for an area of said metal front-side contact, and is arranged on and covers a part of said highly $p^+$-type doped layer portion while leaving uncovered another part of said highly $p^+$-type doped layer portion onto which said coating layer is directly physically and electrically contacted.

7. The semiconductor optical detector according to claim 1, further comprising a highly $p^+$-type doped semiconductor contact layer provided on a back side of said substrate.

8. The semiconductor optical detector according to claim 1, wherein said electrically conductive and optically transparent material is doped polysilicon.

9. The semiconductor optical detector according to claim 1, wherein said insulating layer has beveled edges on a top surface thereof on which said coating layer is arranged.

10. The semiconductor optical detector according to claim 9, further comprising a protruding structure with perpendicular edges rising above a surface of said substrate and of said active region, and wherein said beveled edges of said insulating layer cover over said perpendicular edges of said protruding structure.

11. The semiconductor optical detector according to claim 1, wherein said insulating layer consists of $SiO_2$.

12. The semiconductor optical detector according to claim 11, wherein said insulating layer consisting of $SiO_2$ is arranged directly on said active region.

13. The semiconductor optical detector according to claim 1, further comprising a metal front-side contact arranged on and electrically contacting said active region, wherein said coating layer covers essentially an entire outer front-side surface of said insulating layer and of said substrate except for an area at and adjoining said metal front-side contact to avoid an electrical connection between said coating layer and said metal front-side contact.

14. The semiconductor optical detector according to claim 1, wherein said coating layer does not physically contact said active region and does not electrically contact said active region.

15. The semiconductor optical detector according to claim 1, wherein said coating layer forms an outermost surface of said semiconductor optical detector.

16. The semiconductor optical detector according to claim 1, wherein said semiconductor optical detector does not include an external conductor connected to said coating layer.

* * * * *